(12) United States Patent
Torpey et al.

(10) Patent No.: US 10,357,823 B2
(45) Date of Patent: Jul. 23, 2019

(54) INVESTMENT CASTING

(71) Applicant: ROLLS-ROYCE plc, London (GB)

(72) Inventors: John S. Torpey, Derby (GB); George Durrant, Derby (GB); Felicity Freeman, Derby (GB)

(73) Assignee: ROLLS-ROYCE plc, London (GB)

( * ) Notice: Subject to any disclaimer, the term of this patent is extended or adjusted under 35 U.S.C. 154(b) by 74 days.

(21) Appl. No.: 15/676,179

(22) Filed: Aug. 14, 2017

(65) Prior Publication Data

US 2018/0071817 A1   Mar. 15, 2018

(30) Foreign Application Priority Data

Sep. 12, 2016 (GB) .................................. 1615423.9

(51) Int. Cl.

| | | |
|---|---|---|
| *B22D 27/04* | (2006.01) | |
| *B22C 7/02* | (2006.01) | |
| *B22C 9/04* | (2006.01) | |
| *B22C 19/04* | (2006.01) | |
| *C30B 11/00* | (2006.01) | |
| *C30B 29/52* | (2006.01) | |
| *B01F 3/04* | (2006.01) | |

(52) U.S. Cl.
CPC ............... *B22D 27/045* (2013.01); *B22C 7/02* (2013.01); *B22C 9/04* (2013.01); *B22C 19/04* (2013.01); *C30B 11/00* (2013.01); *C30B 29/52* (2013.01); *B01F 2003/04134* (2013.01); *F05D 2240/126* (2013.01)

(58) Field of Classification Search
CPC ........ B22D 27/04; B22D 27/045; B22C 7/02; B22C 9/04; B22C 19/04

USPC ..................... 164/516, 361, 45, 122.1, 122.2
See application file for complete search history.

(56) References Cited

U.S. PATENT DOCUMENTS

| | | |
|---|---|---|
| 2003/0145974 A1 | 8/2003 | Hainz |
| 2004/0173336 A1 | 9/2004 | Graham |
| 2015/0224568 A1 | 8/2015 | Fargeas et al. |

FOREIGN PATENT DOCUMENTS

| | | |
|---|---|---|
| CN | 105290380 A | 2/2016 |
| FR | 3033721 A1 | 9/2016 |

OTHER PUBLICATIONS

Feb. 20, 2018 Search Report issued in European Patent Application No. 17186123.0.
Mar. 13, 2017 Search Report issued in British Patent Application No. 1615423.9.

*Primary Examiner* — Kevin P Kerns
(74) *Attorney, Agent, or Firm* — Oliff PLC

(57) ABSTRACT

A method for designing a baffle including using patterns to produce an array of shell moulds, generating a 3-D image of the outer surface of each shell mould in the array of shell moulds, stacking the individual 3-D images for a plurality of the shell moulds to produce a conglomerate shell mould profile, determining a maximum cross sectional area of the conglomerate shell mould profile in a plane orthogonal to a direction along which the shell moulds are to be drawn through the baffle, defining a baffle profile segment which is consistent with a substantial portion of the conglomerate shell mould profile at the maximum cross sectional area, scaling the baffle profile segment to provide an offset clearance between the baffle profile segment and the maximum cross sectional area of the conglomerate shell mould profile, and reproducing the baffle profile segment to provide an array of baffle profile segments.

13 Claims, 5 Drawing Sheets

INVESTMENT CASTING

FIELD OF THE INVENTION

The present invention relates to component casting and more particularly but not exclusively to component casting involving directional solidification of single crystal components for engines, such as blades, seal segments and nozzle guide vanes.

BACKGROUND TO THE INVENTION

It is known to use casting to produce a wide range of components with complex shapes that would be otherwise difficult or uneconomical to manufacture by other methods. Molten material is poured into a mould which defines the shape of the component. The material is then allowed to cool and solidify in the shape of the mould. Where the material has a melting point well above standard ambient temperature and pressure (SATP) (which is typical for most metals), the pouring of the molten material takes place within a furnace. It is known to control the cooling of the molten material in the mould to control the microstructure of the solidified material.

It is known to provide multiple components simultaneously by arranging a plurality of moulds in a single assembly. The moulds are connected by a tree-like network of casting channels through which molten material from a casting cup can be fed to the multiple moulds simultaneously.

In, for example, turbine blades it is desirable to provide a single crystal component. This is achieved through a process of "directional solidification" wherein control is exerted over the nucleation and the growth of single crystals in a molten metal as it passes from its liquid state to a solid state. Once filled, the moulds are collectively drawn from the furnace in a controlled manner.

FIG. 1 shows in schematic a known apparatus for the simultaneous manufacture of multiple cast components using a directional solidification process. As shown in the figure the apparatus comprises a pouring cup 1 into which molten material M is poured. A plurality of feed channels 2 extend radially around the centrally arranged cup 1 to the top end of the moulds 3. Molten material M poured into the cup 1 flows along the feed channels 2 and into the moulds 3. Each mould 3 is provided with a seed crystal 4 at a bottom end. Beneath the bottom end of the moulds 3 is a chill plate 5 which is maintained generally at a temperature below the melting point of the material M creating a temperature gradient from the bottom to the top of the moulds 3. The moulds are enclosed by a heat source 6 which encircles the cup 1 and mould 3 assembly. With the moulds filled, the assembly is drawn in a controlled manner out of the heat source in the direction of arrow A to ensure directional solidification from the bottom of the moulds 3 (where the seed crystal 4 is arranged) to the top of the moulds 3. The assembly passes through a baffle 7 which separates the hot zone in which the metal is introduced from a cold zone. The combination of a single crystal seed 4 with the controlled cooling encourages growth of a single crystal structure in the semi-molten casting. The skilled addressee will be familiar with alternative single crystal starters which can be used in place of the seed crystal Moulds for the described apparatus may be formed using the so called "lost pattern" or "investment casting" method (though other methods may be used). In this method, a pattern of the desired component shape is formed from a wax or other material of low melting point. The pattern is coated in ceramic slurry which is subsequently dried and fired to form a ceramic shell around the pattern. The pattern can then be removed from the shell, for example by melting and pouring or leaching, to provide a shell mould, the cavity of which defines the desired component shape.

Two critical aspects of the directional solidification process are the mould thickness and the clearance between the exposed surface of the mould and the baffle. Both of these aspects are difficult to control. In the case of the mould thickness, it is very difficult to get accurate measurement data of this without destroying the mould. To avoid baffle/mould interaction, the baffle must be designed to provide a minimum clearance which allows free passage of the mould at its maximum plan view dimensions through the baffle. It is difficult to get data on this maximum plan view profile of the moulds to generate an optimum baffle profile.

It is known to design baffles by reference to a CAD model of the wax patterns used to produce the shell moulds. The baffle profile is thus designed to follow the profile of the wax patterns with a separation between the baffle and the wax profiles selected to be large enough to ensure clear passage of the outer surface of the shell moulds through the baffle. This relies on a best guess as to the maximum dimension of the shell mould in a plan view. Hence, the baffle is typically designed with a larger gap than might actually be needed resulting in below optimal cooling and consequent metallurgical scrap rates which can be more than 15% of throughput.

The present invention aims to provide an apparatus which facilitates more effective cooling of molten material during a directional solidification process by comparison to the described prior art methods.

STATEMENT OF THE INVENTION

In accordance with the present invention there is provided a method for designing a baffle for use with an array of shell moulds in a directional solidification casting apparatus, the method comprising;

providing an array of patterns;

using the array of patterns in a lost pattern process to produce an array of shell moulds;

imaging the outer surface of each shell mould in the array of shell moulds;

for each shell mould, determining a plane orthogonal to a direction along which the shell moulds are to be drawn through the baffle in a subsequent directional solidification process and in which a 2-D profile of the shell mould has maximum dimensions;

stacking the individual image profiles for a plurality of the shell moulds to produce a conglomerate shell mould profile;

defining a baffle profile segment which is consistent with a substantial portion of the conglomerate shell mould profile;

scaling the baffle profile segment to provide an offset clearance between the baffle profile segment and the conglomerate shell mould profile;

reproducing the baffle profile segment to provide an array of baffle profile segments whereby to form in the baffle a baffle profile which is configured to allow clear passage of the array of shell moulds in the subsequent directional solidification process.

The imaging step may involve generating a 3-D image of the outer surface of each shell mould in the array of shell moulds; stacking the individual 3-D images for a plurality of the shell moulds to produce a conglomerate shell mould profile and determining the image profile from the conglomerate shell mould profile.

Suitable 3-D imaging techniques include (without limitation) 3-D structured light and scanning laser techniques. 3-D imaging of the shell moulds may involve providing a 3-D image of the array of shell moulds and selectively cropping individual shell mould images from the image of the array.

The patterns may be wax patterns. The shell moulds may comprise a ceramic shell formed from ceramic slurry applied to the patterns which is subsequently dried to form the ceramic shell.

The array of patterns and array of baffle profile segments may comprise a circumferential array within which the patterns/baffle profile segments are equally spaced. Where the arrays are circumferential, the baffle profile segment may be reproduced by rotation around a centre point at a radius equal to the radial positioning of the patterns.

The offset clearance is desirably less than 15 mm; preferably the offset clearance is in the range from 1 to 10 mm.

The shell moulds may define the shape of a component for a gas turbine engine. For example, the component is an aerofoil such as a turbine blade or nozzle guide vane.

Controlled cooling in a subsequent directional solidification process may be further improved by providing a 3-D image of the pattern array, aligning the 3-D image of the pattern array with a 3-D image of the array of shell moulds and deducting the pattern array 3-D image from the 3-D image of the array of shell moulds whereby to determine the thickness of the shell mould walls. With knowledge of shell mould wall thickness, optimum cooling parameters such as (but without limitation) rate of withdrawal of shell moulds through the baffle during a subsequent directional solidification process can be determined. Such knowledge may also be used to redesign patterns.

It will be appreciated that the method enables provision of a full 3D representation of shell thickness for each individual mould in a non-destructive manner. This dimensional data can be used to improve and optimize the shelling process, facilitating the development of shell moulds which result in optimized heat loss and thermal conditions for producing a directionally solidified component. Product quality can thus be improved and better controlled, and scrap rates can be reduced.

BRIEF DESCRIPTION OF DRAWINGS

For the purposes of exemplification, an embodiment of the method will now be described with reference to the accompanying Figures in which:

FIG. 1 has been described above.

DETAILED DESCRIPTION OF EMBODIMENTS

Figure 1:
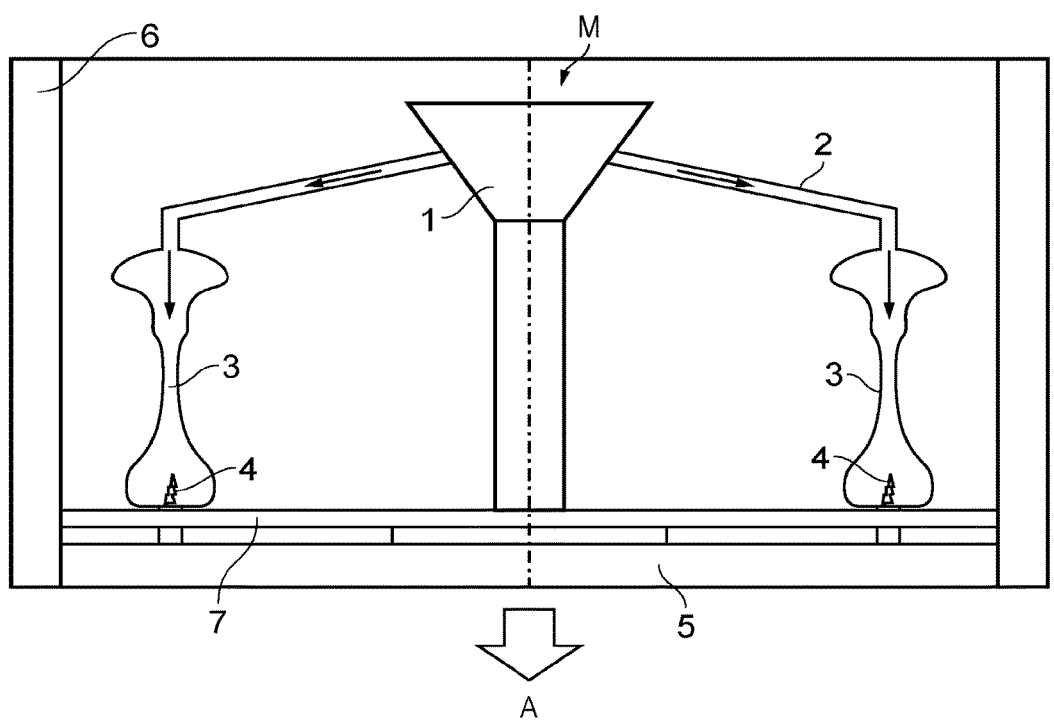
FIG. 1 shows in schematic a known apparatus for the simultaneous manufacture of multiple cast components using a directional solidification process.
Figure 2:
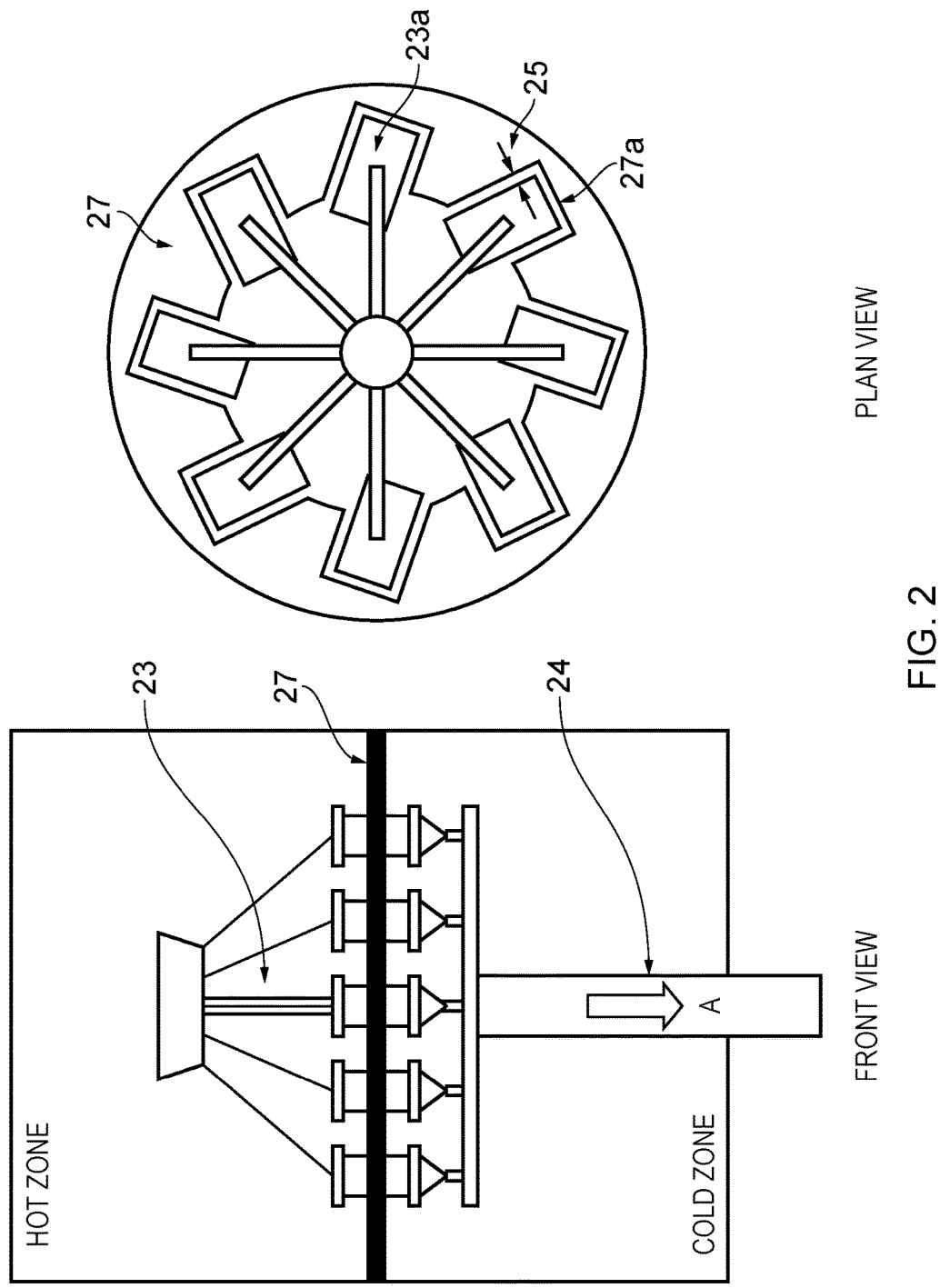
FIG. 2 shows front and plan views of an apparatus similar to that of FIG. 1 providing further detail of the baffle.
Figure 3:
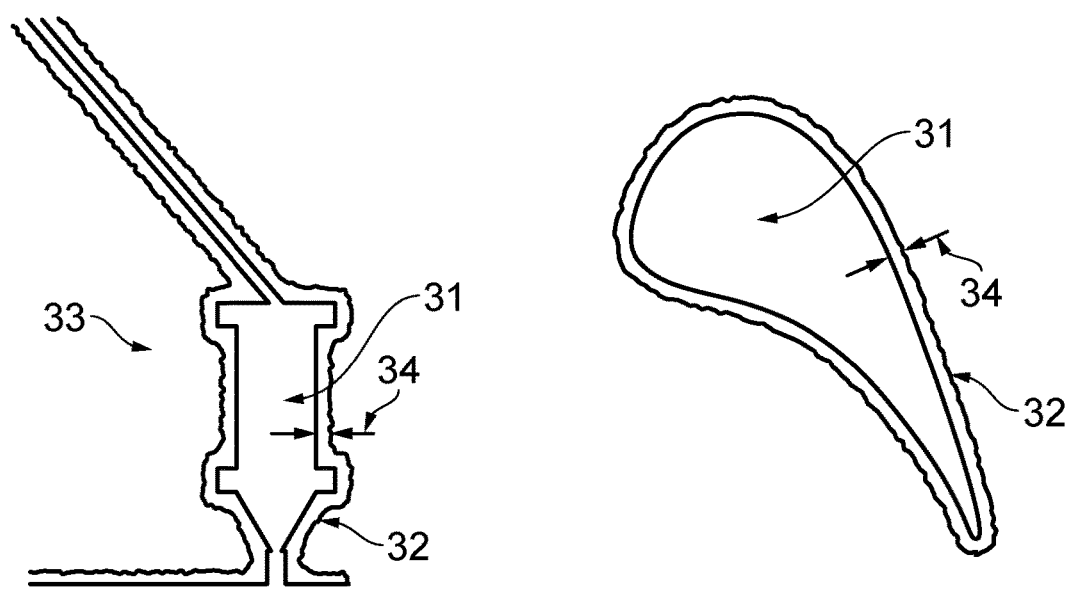
FIG. 3 shows orthogonal cross sectional views of shell moulds for use in a directional solidification apparatus similar to that of FIGS. 1 and 2.

As can be seen in FIG. 2, a directional solidification apparatus comprises an array 23 of previously manufactured shell moulds 23a arranged circumferentially and equally spaced from each other. The array can be drawn in the direction A by means of a ram 24. A baffle 27 defines a barrier between a hot zone (at the top of the front view) and a cold zone (at the bottom of the front view). As can be seen from the plan view the baffle has a profile made up of individual profile segments 27a which are each consistent with a substantial portion of a perimeter of the shell moulds 23a allowing an offset clearance 25 which facilitates clear passage of the array of shell moulds 23 as they move in the direction A in a directional solidification process.

As can be seen a shell mould 33 has a cavity 31 bounded by a wall 32. The wall has a thickness 34 which, as can be seen, is variable across the wall 32. In the Figure shown, the shell mould 33 is shaped to cast an aerofoil shape, for example, a turbine blade for a gas turbine engine.

Figure 4:
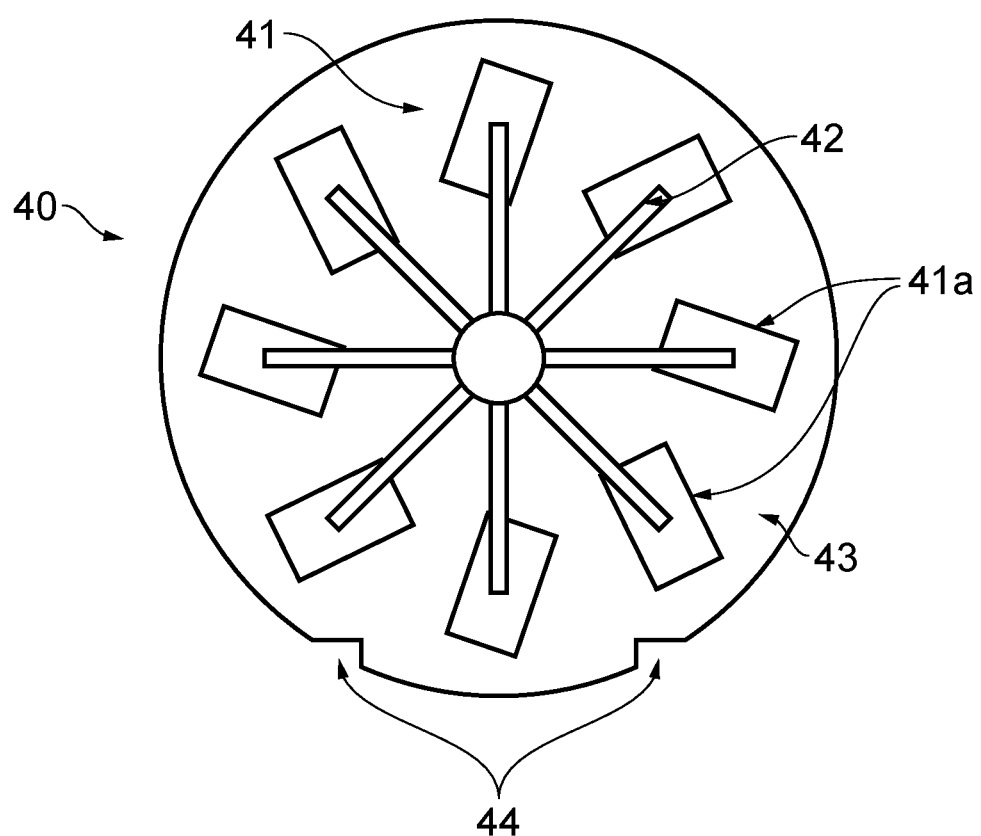
FIG. 4 shows an array of wax patterns provided in a first step of a method in accordance with the invention.

FIG. 4 shows a plan view of a product of a first step in a method in accordance with the invention. The figure shows a shell mould assembly 40 comprising multiple shell moulds 41a arranged in a circumferential array 41 and supported on a frame/molten material delivery network 42. The frame 42 is fixed to a base plate 43. The base plate is provided with notches 44 which allow the rotational orientation of the assembly to be easily identified.

Figure 5:
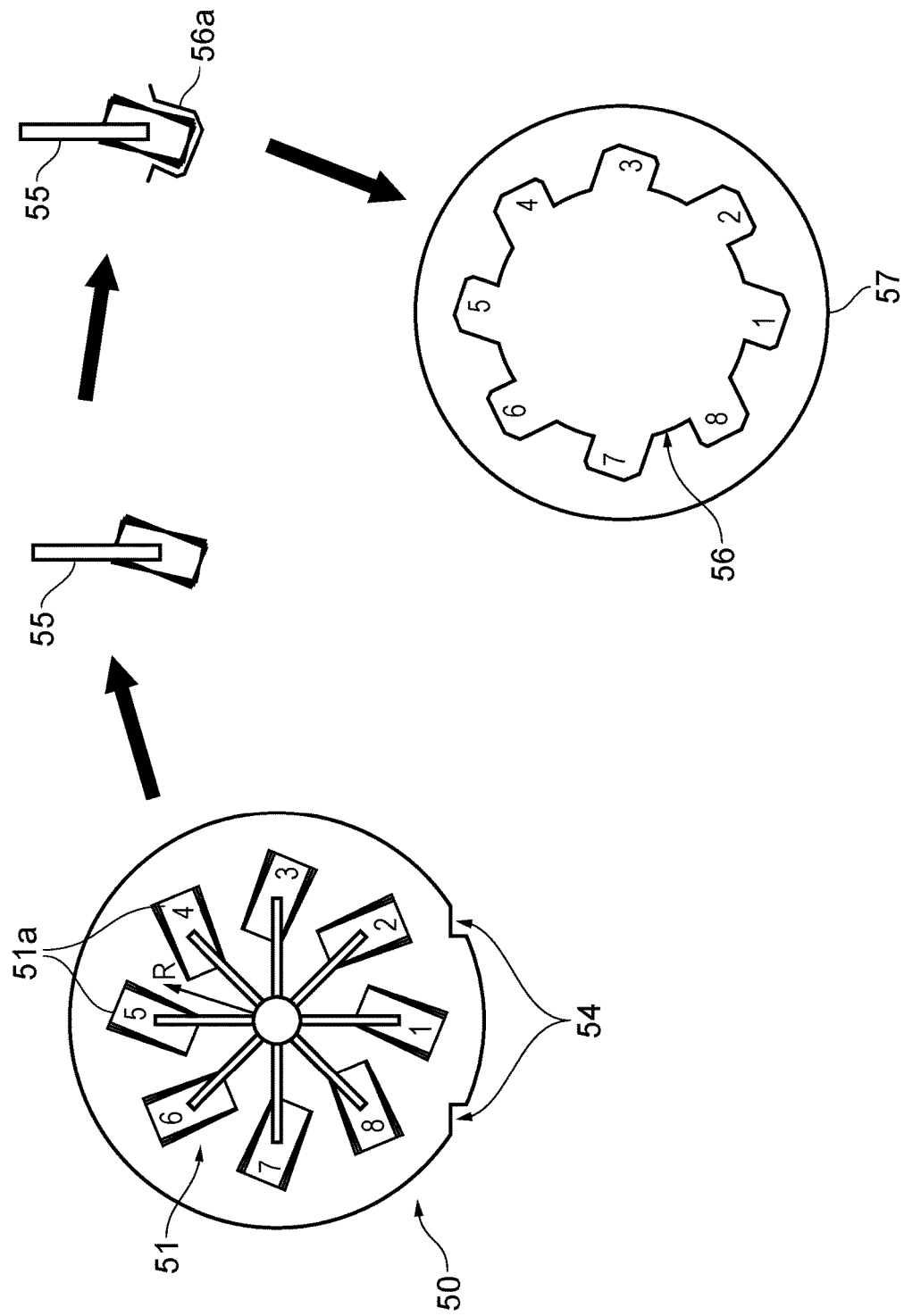
FIG. 5 illustrates method steps taken in accordance with the invention to define the profile of a baffle suited to be used in a directional solidification apparatus.

As shown in FIG. 5, an image 50 is taken of the shell mould assembly 40. The image shows an array 51 of individual shell mould images 51a. The individual shell mould images 51a are individually identifiable by a number 1, 2 . . . 8, with 1 representing the image 1 of a shell mould between the notches 54. In a subsequent step, individual image segments representing the individual shell mould images are isolated and then conglomerated to produce a conglomerate image 55 of a shell mould. Using the conglomerate image 55 as a reference, a baffle profile segment 56a is defined which is consistent with a substantial portion of the shell mould profile shown in the conglomerate image 55. The defined baffle profile segment 56a is then rotated about a point at a radius R which substantially equals the distance from a centre of the shell mould assembly 50 to an end of any of the support arms seen in the image. The baffle profile segment 56a is then reproduced for each of the shell moulds, spaced apart at the same angular separation as the shell mould images in the shell mould assembly image. The result is a baffle profile 56 comprising an array of baffle profile segments 1, 2, . . . 8. A baffle 57 made to this design is thus suited to use in a directional solidification apparatus which includes the shell mould assembly 40 of FIG. 4.

It will be understood that the invention is not limited to the embodiments above-described and various modifications and improvements can be made without departing from the concepts described herein and claimed in the accompanying claims. Except where mutually exclusive, any of the features may be employed separately or in combination with any other features and the disclosure extends to and includes all combinations and sub-combinations of one or more features described herein.

The invention claimed is:

1. A method for designing a baffle for use with an array of shell moulds in a directional solidification casting apparatus, the method comprising;
  providing an array of patters;
  using the array of patterns in a lost pattern process to produce an array of shell moulds;
  imaging an outer surface of each shell mould in the array of shell moulds; for each shell mould, determining a plane orthogonal to a direction A along which the array of shell moulds are to be drawn through the baffle in a subsequent directional solidification process and in which a 2-D profile of each of the shell moulds has maximum dimensions;

stacking individual image profiles for a plurality of the shell moulds to produce a conglomerate shell mould profile;

defining a baffle profile segment which is consistent with a substantial portion of the conglomerate shell mould profile;

scaling the baffle profile segment to provide an offset clearance between the baffle profile segment and the conglomerate shell mould profile;

reproducing the baffle profile segment to provide an array of baffle profile segments whereby to form in the baffle a baffle profile which is configured to allow clear passage of the array of shell moulds in the subsequent directional solidification process.

2. A method as claimed in claim 1 wherein the steps of imaging and stacking involve; in sequence, generating a 3-D image of the outer surface of each shell mould in the array of shell moulds; stacking the individual 3-D images for a plurality of the shell moulds to produce a conglomerate shell mould profile and determining the image profile from the conglomerate shell mould profile.

3. A method as claimed in claim 1 wherein the array of patterns and array of baffle profile segments each comprise a circumferential array within which the patterns/baffle profile segments are equally spaced.

4. A method as claimed in claim 3 wherein the baffle profile segment is reproduced by rotation around a centre point at a radius equal to the radial positioning of the patterns whereby to form a rotationally symmetrical baffle profile.

5. A method as claimed in claim 1 wherein the offset clearance is 15 mm or less.

6. A method as claimed in claim 5 wherein the offset clearance is 10 mm or less.

7. A method as claimed in claim 6 wherein the offset clearance is in the range 1 mm to 5 mm.

8. A method as claimed in claim 1 further comprising providing a 3-D image of the pattern array, aligning the 3-D image of the pattern array with a 3-D image of the array of shell mould and deducting the pattern array 3-D image from the 3-D image of the array of shell moulds whereby to determine the thickness of the shell mould walls.

9. A method as claimed in claim 1 wherein the patterns are wax patterns and the shell moulds comprise a ceramic shell formed from ceramic slurry applied to the wax patterns which is subsequently dried to form the ceramic shell and the wax is removed to form the shell cavity.

10. A method as claimed in claim 1 wherein 3-D images are generated using a 3-D structured light technique or a scanning laser technique.

11. A method as claimed in claim 1 wherein the shell mould define the shape of a component for a gas turbine engine.

12. A method as claimed in claim 11 wherein the component is an aerofoil.

13. A method as claimed in claim 12 wherein the component is a turbine blade or a nozzle guide vane.

* * * * *